United States Patent
Zhao

(10) Patent No.: US 12,490,384 B2
(45) Date of Patent: Dec. 2, 2025

(54) FLEXIBLE CIRCUIT BOARD, DISPLAY MODULE, AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jianhua Zhao, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 18/564,232

(22) PCT Filed: Nov. 8, 2023

(86) PCT No.: PCT/CN2023/130469
§ 371 (c)(1),
(2) Date: Nov. 27, 2023

(87) PCT Pub. No.: WO2025/091549
PCT Pub. Date: May 8, 2025

(65) Prior Publication Data
US 2025/0159814 A1    May 15, 2025

(30) Foreign Application Priority Data
Oct. 31, 2023   (CN) .......................... 202311450119.4

(51) Int. Cl.
*H05K 1/18* (2006.01)
*G02F 1/1345* (2006.01)
(Continued)

(52) U.S. Cl.
CPC .......... *H05K 1/189* (2013.01); *G02F 1/13452* (2013.01); *H05K 1/147* (2013.01); *H10K 59/131* (2023.02); *H05K 2201/10128* (2013.01)

(58) Field of Classification Search
CPC ....... H05K 1/189; H05K 1/147; H10K 59/131
(Continued)

(56) References Cited

U.S. PATENT DOCUMENTS

2009/0315856 A1* 12/2009 Oikawa .................. H05K 3/361
174/254
2017/0357122 A1* 12/2017 Oh ......................... H05K 3/361

FOREIGN PATENT DOCUMENTS

CN    110999545 A    4/2020
CN    111799240 A    10/2020
(Continued)

OTHER PUBLICATIONS

Chinese Office Action issued in corresponding Chinese Patent Application No. 202311450119.4 dated Jan. 24, 2025, pp. 1-9, 17pp.

*Primary Examiner* — Andargie M Aychillhum
(74) *Attorney, Agent, or Firm* — The Roy Gross Law Firm, LLC; Roy D. Gross

(57) ABSTRACT

The present application provides a flexible circuit board, a display module, and an electronic device. The flexible circuit board includes first binding terminals disposed on a first surface of a substrate layer and pressure transmission parts disposed on a second surface of the substrate layer, where each of the pressure transmission parts includes at least a portion corresponding to at least a portion of respective one of the first binding terminals so that the pressure transmission part can transmit a pressure to the first binding terminal through the substrate layer, thereby alleviating a problem that the inclination of the side pressure is generated
(Continued)

when the flexible circuit board and the printed circuit board assembly are bound.

18 Claims, 8 Drawing Sheets

(51) Int. Cl.
*H05K 1/14* (2006.01)
*H10K 59/131* (2023.01)

(58) Field of Classification Search
USPC .......................................................... 174/254
See application file for complete search history.

(56) References Cited

FOREIGN PATENT DOCUMENTS

| | | |
|---|---|---|
| CN | 114253037 A | 3/2022 |
| CN | 216291564 U | 4/2022 |
| CN | 114973953 A | 8/2022 |
| JP | 2001305570 A | 10/2001 |

\* cited by examiner

FLEXIBLE CIRCUIT BOARD, DISPLAY MODULE, AND ELECTRONIC DEVICE

CROSS REFERENCE TO RELATED APPLICATIONS

This application is a National Phase of PCT Patent Application No. PCT/CN2023/130469, having International filing date of Nov. 8, 2023, which claims the benefit of priority of Chinese Patent Application No. 202311450119.4, filed Oct. 31, 2023, the contents of which are all incorporated herein by reference in their entirety.

TECHNICAL FIELD

The present application relates to the field of display technologies, and more particularly to a flexible circuit board, a display module, and an electronic device.

BACKGROUND

Currently, a Flexible Print Circuit (FPC) is mostly used to input a signal of a Printed Circuit Board Assembly (PCBA) to a display panel in a medium-sized and large-sized display device (such as a folding notebook computer and a tablet computer), thereby realizing processing and power supply of a signal in the panel. The flexible circuit board and the printed circuit board assembly are connected by high-temperature hot-pressing bonding. Since the number of binding terminals (Pin) in bonding regions of both the flexible circuit board and the printed circuit board assembly is relatively large, the binding terminals in the bonding regions are both arranged in a double-row design. For the flexible circuit board, the flexible circuit board includes a bottom copper layer and a top copper layer, where the bottom copper layer is formed with first wirings and double-row of first binding terminals, the top copper layer is formed with second wirings, a first row of binding terminals in the double-row of first binding terminals are directly electrically connected to a portion of the first wirings, and a second row of binding terminals in the double-row of first binding terminals is electrically connected to another portion of the first wirings by a second wiring bridge. However, misalignment of the second wirings and the double-row of first binding terminals may cause a phenomenon that inclination of a side pressure is generated when the flexible circuit board and the printed circuit board assembly are bound, thereby causing problems of abnormal bonding impedance of the binding regions and abnormal reliability tests.

SUMMARY

The present application provides a flexible circuit board, a display module, and an electronic device, so as to alleviate the technical problems that the inclination of the side pressure is generated when the flexible circuit board and the printed circuit board assembly are bound.

To solve the above problems, the present application may provide technical solutions as follows.

An embodiment of the present application provides a flexible circuit board, including:
  a substrate layer including a first surface and an opposite second surface, where the first surface includes a wiring region and a first binding region disposed on one side of the wiring region;
  a plurality of first wirings disposed on the first surface and located in the wiring region, where the plurality of first wirings are extended in a first direction and spaced apart in a second direction, and the plurality of first wirings include first-type wirings and second-type wirings electrically isolated from each other;
  a plurality of first binding terminals disposed on the first surface and located in the first binding region, where the plurality of first binding terminals are extended in the first direction and spaced apart in the second direction, the plurality of first binding terminals include first-type binding terminals and second-type binding terminals electrically isolated from each other, the second-type binding terminals are located on one side of the first-type binding terminals away from the first wirings, each of the first-type binding terminals is electrically connected to at least one of the first-type wirings, and each of the second-type binding terminals is electrically connected to at least one of the second-type wirings;
  a plurality of second wirings disposed on the second surface and corresponding to gaps among the first-type binding terminals, where each of the second wirings is electrically connected between the second-type wirings and the second-type binding terminals; and
  a plurality of pressure transmission parts disposed on the second surface, where each of the pressure transmission parts includes at least a portion corresponding to at least a portion of respective one of the first binding terminals to enable the pressure transmission part to transmit pressure to the first binding terminals through the substrate layer.

In the flexible circuit board provided in the embodiment of the present application, an elastic modulus of each of the pressure transmission parts is greater than or equal to an elastic modulus of respective one of the second wirings.

In the flexible circuit board provided in the embodiment of the present application, a material of each of the pressure transmission parts is the same as a material of respective one of the second wirings.

In the flexible circuit board provided in the embodiment of the present application, a thickness of each of the pressure transmission parts is greater than or equal to a thickness of one of the second wirings In the flexible circuit board provided in the embodiment of the present application, a first gap is disposed between two adjacent ones of the first-type binding terminals, a width of each of the second wirings in the second direction is less than a distance of the first gap, and an orthographic projection of each of the second wirings on the substrate layer is located within a range of an orthographic projection of the first gap on the substrate layer.

In the flexible circuit board provided in the embodiment of the present application, the flexible circuit board further includes a cover layer that covers the second wirings, the pressure transmission parts, and the substrate layer.

In the flexible circuit board provided in an embodiment of the present application, a thickness of the cover layer covering the second wirings is less than a thickness of the cover layer covering the substrate layer.

In the flexible circuit board provided in the embodiment of the present application, each of the pressure transmission parts includes a first pressure transmission sub-part located between two adjacent ones of the second wirings and disposed corresponding to respective one of the first-type binding terminals.

In the flexible circuit board provided in the embodiment of the present application, a second gap is disposed between two adjacent ones of the second wirings, the first pressure transmission sub-part is located in the second gap, and the width of the first pressure transmission sub-part in the second direction is less than a distance of the second gap.

In the flexible circuit board provided in an embodiment of the present application, a central axis of the first pressure transmission sub-part in the first direction coincides with a central axis of respective one of the first-type binding terminals in the first direction.

In the flexible circuit board provided in the embodiment of the present application, the first-type binding terminals are disposed opposite to the second-type binding terminals, the second wirings are further disposed corresponding to gaps among the second-type binding terminals, and each of the pressure transmission parts further includes a second pressure transmission sub-part disposed corresponding to respective one of the second-type binding terminals.

In the flexible circuit board provided in the embodiment of the present application, each of the second wirings is electrically connected to one end of respective one of the second-type binding terminals away from the first-type binding terminals.

In the flexible circuit board provided in the embodiment of the present application, a third gap is disposed between two adjacent ones of the second-type binding terminals, a width of each of the second wirings in the second direction is less than a distance of the third gap, and an orthographic projection of each of the second wirings on the substrate layer is located within a range of an orthographic projection of the third gap on the substrate layer.

In the flexible circuit board provided in the embodiment of the present application, a fourth gap is further disposed between two adjacent ones of the second wirings, the second pressure transmission sub-part is located in the fourth gap, and the width of the second pressure transmission sub-part in the second direction is less than a distance of the fourth gap.

In the flexible circuit board provided in the embodiment of the present application, a central axis of the second pressure transmission sub-part in the first direction coincides with a central axis of the second-type binding terminal in the first direction.

In the flexible circuit board provided in the embodiment of the present application, the first-type binding terminals are interleaved with the second-type binding terminals, and each of the second wirings is electrically connected to one end of respective one of the second-type binding terminals close to the first-type binding terminals; and each of the pressure transmission parts further includes a third pressure transmission sub-part disposed corresponding to respective one of the second-type binding terminals.

In the flexible circuit board provided in the embodiment of the present application, a central axis of the third pressure transmission sub-part in the first direction coincides with a central axis of the second-type binding terminal in the first direction.

In the flexible circuit board provided in the embodiment of the present application, the first-type binding terminals are interleaved with the second-type binding terminals, each of the second wirings is electrically connected to one end of respective one of the second-type binding terminals away from the first-type binding terminals, and a central axis of each of the second wirings in the first direction coincides with a central axis of respective one of the second-type binding terminals in the first direction.

Another embodiment of the present application further provides a display module, including a display panel, a printed circuit board assembly, and a flexible circuit board electrically connected between the display panel and the printed circuit board assembly and including the flexible circuit board of one of the foregoing embodiments; where the printed circuit board assembly includes a second binding region opposite to the first binding region of the flexible circuit board and is provided with a plurality of second binding terminals in the second binding region, and each of the second binding terminals is bound to respective one of the first binding terminals of the flexible circuit board.

In the display module provided in the embodiment of the present application, an orthographic projection of each of the first binding terminals on the printed circuit board assembly is located within a range of an orthographic projection of respective one of the second binding terminals on the printed circuit board assembly.

In the display module provided in the embodiment of the present application, an orthographic projection of a portion of the pressure transmission part corresponding to each of the first binding terminals on the printed circuit board assembly is located within a range of an orthographic projection of respective one of the second binding terminals on the printed circuit board assembly.

In the display module provided in the embodiment of the present application, a central axis of each of the first binding terminals coincides with a central axis of respective one of the second binding terminals.

In the display module provided in the embodiment of the present application, the second binding terminals include third-type binding terminals and fourth-type binding terminals electrically isolated from each other, each of the third-type binding terminals is bound to respective one of the first-type binding terminals on the flexible circuit board, and each of the fourth-type binding terminals is bound to respective one of the second-type binding terminals of the flexible circuit board.

Yet another embodiment of the present application further provides an electronic device, including a display module of one of the foregoing embodiments.

Beneficial Effects

In the flexible circuit board, the display module, and the electronic device provided in the present application, the flexible circuit board includes a substrate layer, both a plurality of first wirings and a plurality of first binding terminals disposed on a first surface of the substrate layer, and both a plurality of second wirings and a plurality of pressure transmission parts disposed on a second surface of the substrate layer, where the first surface includes a wiring region and a first binding region located on one side of the wiring region, the plurality of first wirings are located in the wiring region, the plurality of first wirings are extended in a first direction and spaced apart in a second direction, the plurality of first wirings include first-type wirings and second-type wirings electrically isolated from each other, the plurality of first binding terminals are extended in the first direction and spaced apart in the second direction, the plurality of first binding terminals include first-type binding terminals and second-type binding terminals electrically isolated from each other, the second-type binding terminals are located on one side of the first-type binding terminals away from the first wirings, each of the first-type binding terminals is electrically connected to at least one of the first-type wirings, and each of the second-type binding terminals is electrically connected to at least one of the second-type wirings, the plurality of second wirings are disposed corresponding to gaps among the first-type binding terminals, each of the second wirings is electrically connected between the second-type wirings and the second-type binding terminals, and each of the pressure transmission parts includes at least a portion corresponding to at least a portion of the first binding terminals to enable the pressure transmission part to transmit pressure to the first binding terminals through the substrate layer. As such, when the flexible circuit board is bound to the printed circuit board assembly, each of the pressure transmission parts can apply a positive pressure to the binding terminal through the substrate layer, thereby avoiding inclination of a side pressure occurring in the binding terminal is avoided and solving the technical problems that the inclination of the side pressure is generated when the flexible circuit board and the printed circuit board assembly are bound.

BRIEF DESCRIPTION OF THE DRAWINGS

In order to more clearly illustrate the technical solutions in embodiments of the present application, the accompanying drawings depicted in the description of the embodiments will be briefly described below. It will be apparent that the accompanying drawings in the following description are merely some embodiments of the present application, and other drawings may be obtained from these drawings without creative effort by those skilled in the art.

DETAILED DESCRIPTION

Figure 1:
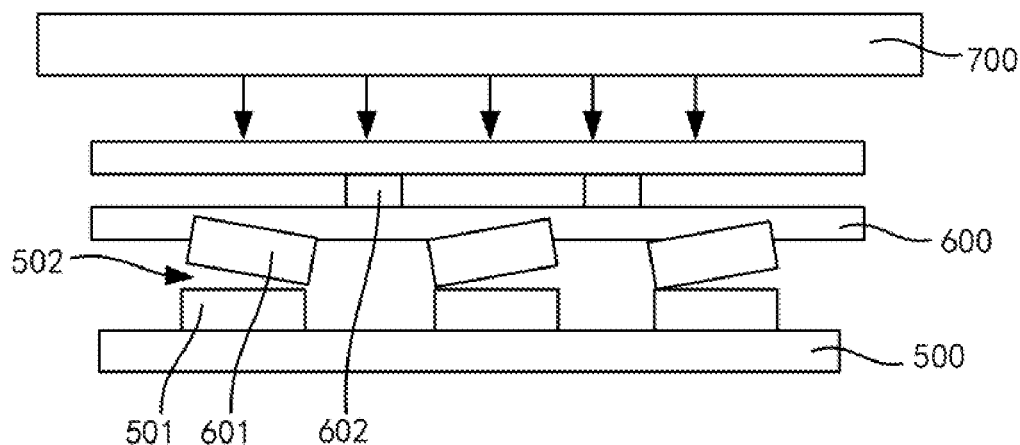
FIG. 1 is a schematic diagram of binding of a flexible circuit board to a printed circuit board assembly in the related art.

The description of the following embodiments refers to the attached drawings to illustrate specific embodiments in which the present application can be implemented. The directional terms mentioned in the present disclosure, such as [up], [down], [front], [back], [left], [right], [inner], [outer], [side], etc., are only the direction of the attached drawings. Therefore, the directional terms used are used to describe and understand the present disclosure, rather than to limit the present disclosure. In the drawings, units with similar structures are indicated by the same reference numerals. In the drawings, thickness of layers and regions may be enlarged for clear understanding and ease of description. That is, the size and thickness of each of components shown in the drawings are arbitrarily shown, but the present application is not limited thereto.

In view of the problems in the related art that the inclination of the side pressure is generated when the flexible circuit board and the printed circuit board assembly are bound, inventors of the present application have found in the research that the problems may be mainly caused by misalignment of the second wirings and the double-row of first binding terminals. Please refer to FIG. 1, which is a schematic diagram of binding of a flexible circuit board to a printed circuit board assembly in the related art. In FIG. 1, a printed circuit board assembly 500 and a flexible circuit board 600 are bonded together by applying a pressure with a pressure mechanism 700. The flexible circuit board 600 is provided with one or more first binding terminals 601, and the printed circuit board assembly 500 is provided with one or more second binding terminals 501. Each of second wirings 602 of the flexible circuit board 600 is disposed corresponding to a gap between two adjacent ones of the first binding terminals 601, so that the second wiring 602 and respective one of the first binding terminals 601 are disposed in a misalignment manner. As such, in a process of binding the printed circuit board assembly 500 to the flexible circuit board 600, the first binding terminals 601 and the second wirings 602 of the flexible circuit board 600 are disposed in a misalignment manner, so that the first binding terminals 601 are inclined with respect to the second binding terminals 501 when a pressure is applied to the flexible circuit board 600 under a high temperature condition, which in turn results in a gap 502 between each of the first binding terminals 601 and respective one of the second binding terminals 501, resulting in poor contact between the first binding terminal 601 on the flexible circuit board 600 and the second binding terminal 501 on the printed circuit board assembly 500 and abnormal bonding impedance of the binding regions and abnormal reliability test.

To this end, the present application provides a flexible circuit board, a display module, and an electronic device to solve the above problems.

Figure 2:
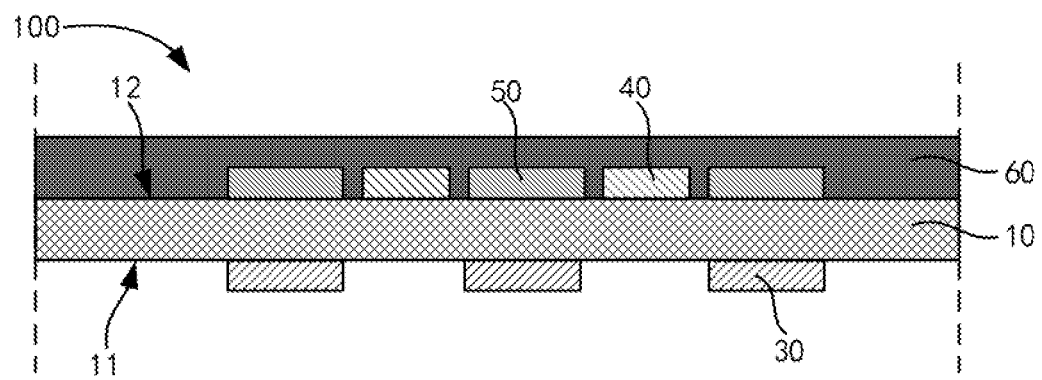
FIG. 2 is a schematic diagram of a cross-section structure of a flexible circuit board according to some embodiments of the present application.
Figure 3:
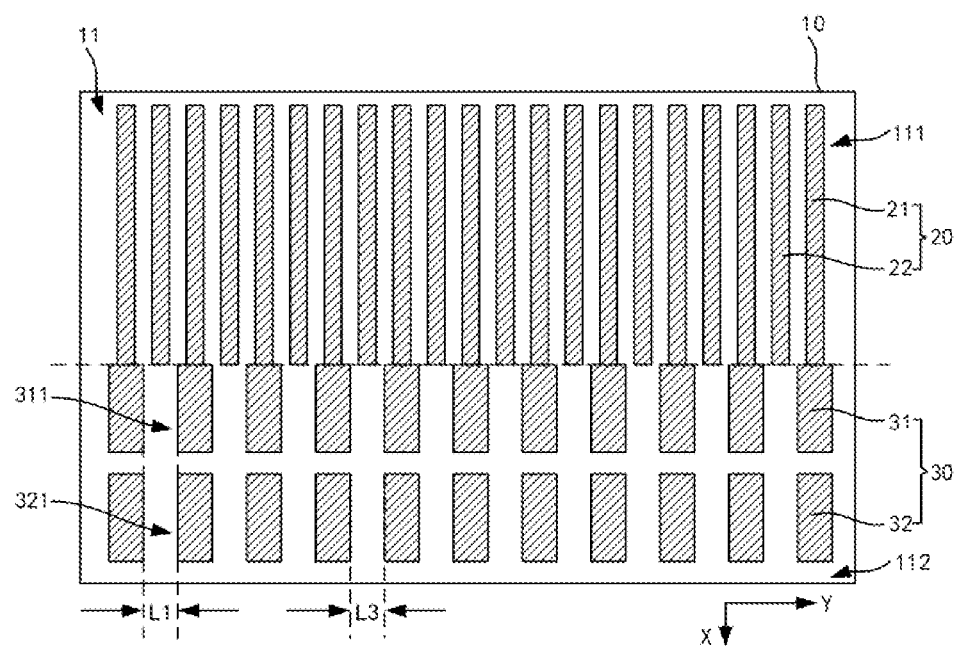
FIG. 3 is a detailed schematic view of a first surface of a substrate layer of FIG. 2.
Figure 4:
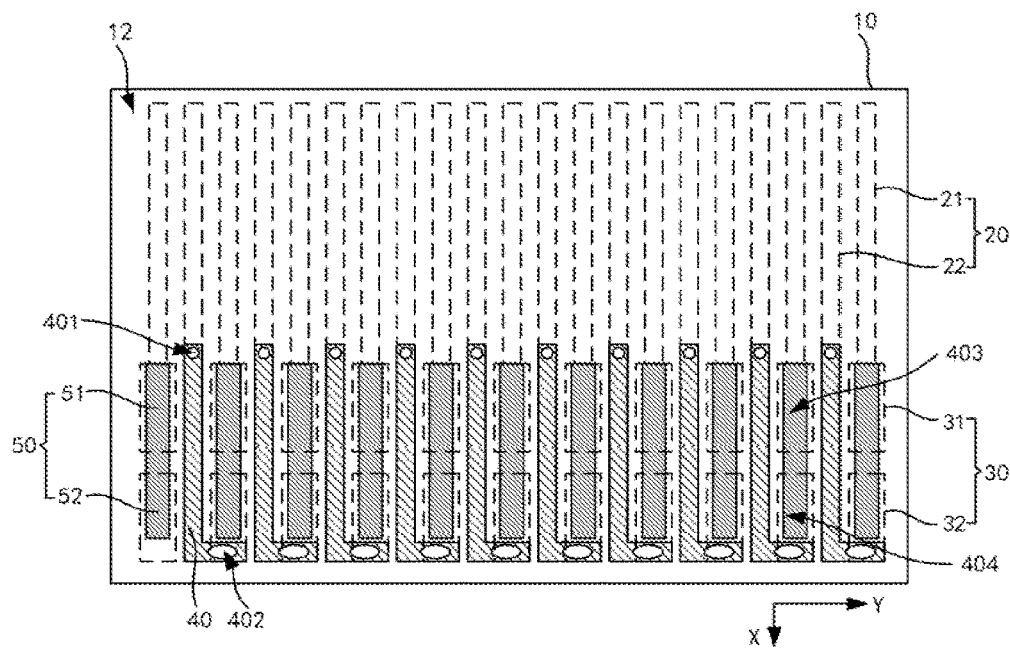
FIG. 4 is a detailed schematic view of a second surface of a substrate layer of FIG. 2.
Figure 5:
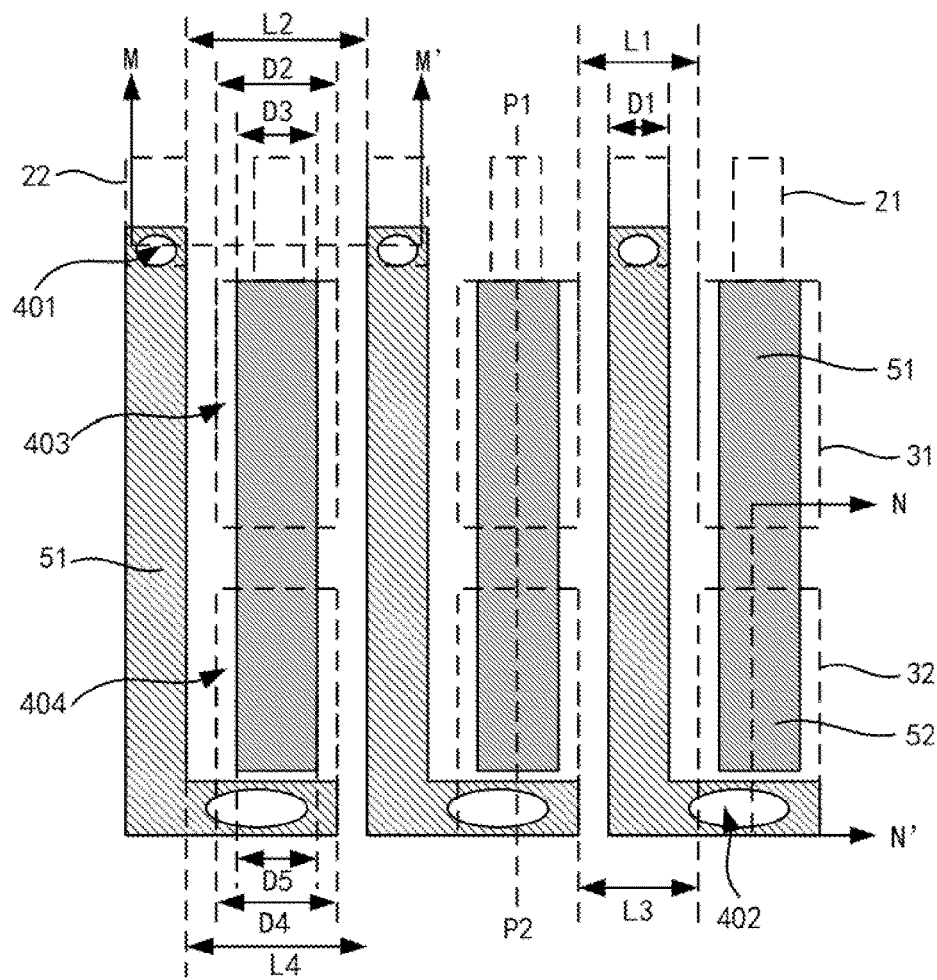
FIG. 5 is a detailed schematic view of second wirings and pressure transmission parts in FIG. 4.
Figure 6:
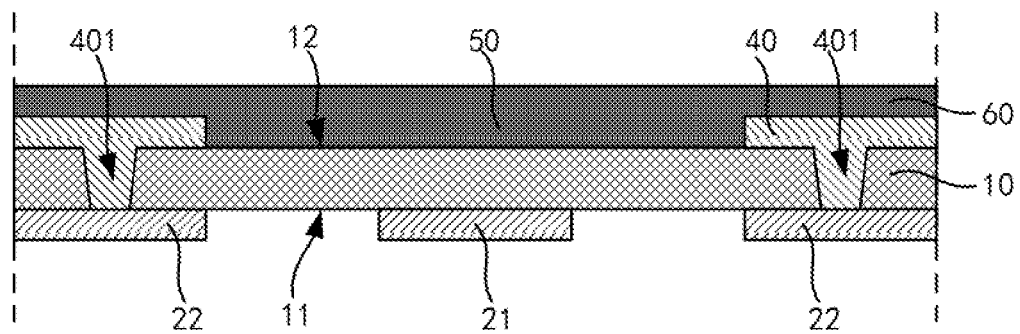
FIG. 6 is a schematic diagram of a cross-section structure along M-M' in FIG. 5.
Figure 7:
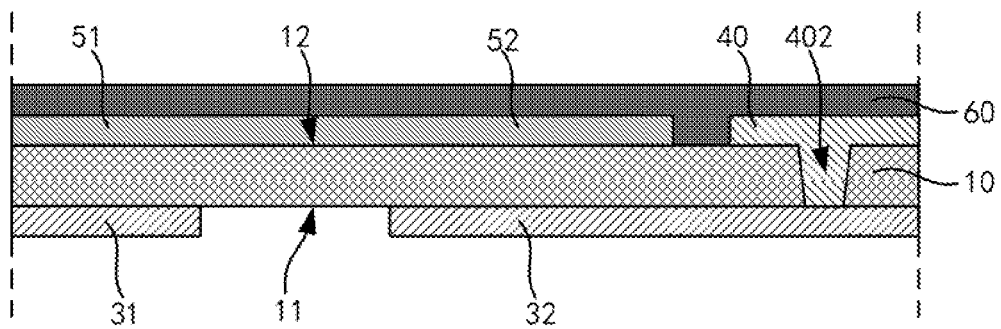
FIG. 7 is a schematic diagram of a cross-section structure along N-N' in FIG. 5.
Figure 8:
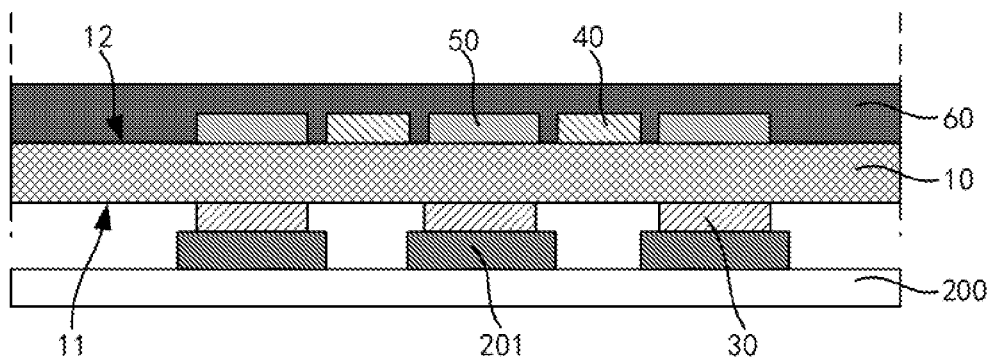
FIG. 8 is a schematic diagram of having bound the flexible circuit board in FIG. 2 to a printed circuit board assembly.

Please refer to FIGS. 2 to 8, where FIG. 2 is a schematic diagram of a cross-section structure of a flexible circuit board according to some embodiments of the present application, FIG. 3 is a detailed schematic view of a first surface of a substrate layer of FIG. 2, FIG. 4 is a detailed schematic view of a second surface of a substrate layer of FIG. 2, FIG. 5 is a detailed schematic view of second wirings and pressure transmission parts in FIG. 4, FIG. 6 is a schematic diagram of a cross-section structure along M-M' in FIG. 5, FIG. 7 is a schematic diagram of a cross-section structure along N-N' in FIG. 5, and FIG. 8 is a schematic diagram of having bound the flexible circuit board in FIG. 2 to a printed circuit board assembly. Please refer to FIGS. 2 and 3, a flexible circuit board 100 includes a substrate layer 10, including a first surface 11 and an opposite second surface 12. The flexible circuit board 100 further includes a plurality of first wirings 20 and a plurality of first binding terminals 30 disposed on the first surface 11, and a plurality of second wirings 40 and a plurality of pressure transmission parts 50 disposed on the second surface 12.

The flexible circuit board 100 further includes a cover layer 60 covering the second wirings 40, the pressure transmission parts 50, and the substrate layer 10. The cover layer 60 may include the same material as the substrate layer 10, for example, a flexible thin film such as Polyimide (PI).

Specifically, referring to FIG. 3, the first surface 11 includes a wiring region 111 and a first binding region 112 located on one side of the wiring region 111. The plurality of first wirings 20 are disposed on the first surface 11 and located in the wiring region 111, where the plurality of first wirings 20 are extended in a first direction X and spaced apart in a second direction Y, and the plurality of first wirings 20 include first-type wirings 21 and second-type wirings 22 electrically isolated from each other; The first-type wirings 21 and the second-type wirings 22 are disposed alternatively to rationally utilize the space of the wiring region 111. The first direction X is different from the second direction Y. For example, the first direction X is a column direction, the second direction Y is a row direction, and the first direction X is perpendicular to the second direction Y.

The plurality of first binding terminals 30 are disposed on the first surface 11 and located in the first binding region 112, where the plurality of first binding terminals 30 are extended in the first direction X and spaced apart in the second direction Y, the plurality of first binding terminals 30 include first-type binding terminals 31 and second-type binding terminals 32 electrically isolated from each other, the second-type binding terminals 32 are located on one side of the first-type binding terminals 31 away from the first wirings 20, each of the first-type binding terminals 31 is electrically connected to at least one of the first-type wirings 21, and each of the second-type binding terminals 32 is electrically connected to at least one of the second-type wirings 22.

Alternatively, the first wirings 20 and the first binding terminals 30 are of the same material, for example both copper. In this case, the first wirings 20 and the first binding terminals 30 are formed under the same process condition, and the first-type wirings 21 and the first-type binding terminals 31 may be integrally formed.

Referring to FIG. 4, the plurality of second wirings 40 are disposed on the second surface 12 and corresponding to gaps among the first-type binding terminals 31, and each of the second wirings 40 is electrically connected between respective one of the second-type wirings 22 and respective one of the second-type binding terminals 32, so that the second-type binding terminal 32 is electrically connected to the second-type binding terminal 22 by the second wiring 40. Specifically, one end of the second wiring 40 close to the first wiring 20 is electrically connected to the second-type wiring 22 through a first via 401, and another end of the second wiring 40 away from the first wiring 20 is electrically connected to the second-type binding terminal 32 through a second via 402. Both the first via 401 and the second via 402 are formed by perforating the substrate layer 10.

The pressure transmission parts 50 are provided on the second surface 12, and each of the pressure transmission parts 50 includes at least a portion corresponding to at least a portion of the first binding terminal 30, so that the pressure transmission part 50 can transmit a pressure to the first binding terminal 30 through the substrate layer 10. As such, when the flexible circuit board 100 is bound to the printed circuit board assembly, each of the pressure transmission parts 50 can apply a positive pressure to the binding terminal corresponding to the pressure transmission part 50 through the substrate layer 10, thereby avoiding inclination of a side pressure occurring in the binding terminal is avoided and solving the technical problems that the inclination of the side pressure is generated when the flexible circuit board and the printed circuit board assembly are bound.

An elastic modulus of each of the pressure transmission parts 50 is greater than or equal to that of respective one of the second wirings 40, so that a hardness of the pressure transmission part 50 is at least not less than or equal to that of the second wiring 40, and when the pressure transmission part 50 and the second wiring 40 are subjected to the same pressure, a deformation amount of the pressure transmission part 50 is less than or equal to that of the second wiring 40, so as to ensure that the bound pressure can be directly applied to the first binding terminal 30 located below the pressure transmission part 50, thereby avoiding the inclination of the side pressure occurring in the first binding terminal 30. Alternatively, the pressure transmission parts 50 and the second wirings 40 are of the same material, for example, both copper, to reduce process difficulty. Each of the pressure transmission parts 50 is in a floating state, that is, the pressure transmission part 50 is not connected to an electrical signal.

Further, in a direction perpendicular to the substrate layer 10, the thickness of each of the pressure transmission parts 50 is greater than or equal to the thickness of respective one of the second wirings 40. When the thickness of the pressure transmission part 50 is equal to the thickness of the second wiring 40, the pressure transmission part 50 and the second wiring 40 can bear the same pressure, and the pressure applied to the pressure transmission part 50 can be applied to the first binding terminal 30 located below the pressure transmission part 50 through the substrate layer 10, thereby avoiding the inclination of the side pressure occurring in the first binding terminal 30. When the thickness of the pressure transmission part 50 is greater than the thickness of the second wiring 40, the pressure transmission part 50 can bear more pressure than the second wiring 40, so that most of the binding pressure is applied to the pressure transmission part 50. As such, the pressure on the pressure transmission part 50 can be applied to the first binding terminal 30 located below the pressure transmission part 50 through the substrate layer 10, thereby avoiding inclination of the side pressure inclination occurring in the first binding terminal 30 while protecting the second wiring 40, so that the binding pressure can be prevented from being applied to the second wiring 40 to cause defects such as cracks in the second wiring 40.

A relative position relationship among the first binding terminal 30, the second wiring 40, and the pressure transmission part 50 will be explained in detail.

Referring to FIGS. 4 and 5, a first gap 311 is disposed between two adjacent ones of the first-type binding terminals 31, and the width D1 of each of the second wirings 40 in the second direction Y is less than the distance L1 of the first gap 311. An orthographic projection of each of the second wirings 40 on the substrate layer 10 is in the range of the orthographic projection of the first gap 311 on the substrate layer 10. In other words, the orthographic projection of each of the second wirings 40 on the substrate layer 10 does not overlap the orthographic projection of respective one of the first-type binding terminals 31 on the substrate layer 10, so as to avoid generation of a coupling capacitance between the second wiring 40 and the first type binding terminal 31, so that the influence on the signal transmission of the first-type wiring 21 can be avoided.

Alternatively, the width D2 of each of the first-type binding terminals 31 in the second direction Y may be in the range from 125 microns to 225 microns, such as 125 microns, 135 microns, 150 microns, 175 microns, 190 microns, 210 microns, 225 microns, etc. The distance L1 of the first gap 311 may be in the range from 125 microns to 225 microns, such as 125 microns, 135 microns, 150 microns, 175 microns, 190 microns, 210 microns, 225 microns, etc. The width D2 of each of the first-type binding terminals 31 in the second direction Y may be equal to the distance L1 of the first gap 311. For example, both the width D2 and the distance L1 may be 175 microns. However, the present application is not limited thereto, and the width D2 of each of the first-type binding terminals 31 of the present application may be further greater than the distance L1 of the first gap 311.

Alternatively, each of the pressure transmission parts 50 includes a first pressure transmission sub-part 51 and a second pressure transmission sub-part 52, where the first pressure transmission sub-part 51 and the second pressure transmission sub-part 52 are both located between two adjacent ones of the second wirings 40, the first pressure transmission sub-part 51 is disposed corresponding to respective one of the first-type binding terminals 31, and the second pressure transmission sub-part 52 is disposed corresponding to respective one of the second-type binding terminals 32.

A second gap 403 is disposed between two adjacent ones of the second wirings 40, the first pressure transmission sub-part 51 is located in the second gap 403, and the width D3 of the first pressure transmission sub-part 51 in the second direction Y is less than a distance L2 of the second gap 403, so as to avoid short-circuiting of adjacent ones of the second wirings 40. Each of the first-type binding terminals 31 is disposed corresponding to the respective second gap 403, and the width D2 of the first-type binding terminal 31 in the second direction Y is less than the distance L2 of the respective second gap 403. An orthographic projection of each of the first-type binding terminals 31 on the substrate layer 10 is in the range of the orthographic projection of the second gap 403 on the substrate layer 10, so as to avoid overlapping of the first-type binding terminal 31 with the second wiring 40.

Alternatively, a width D3 of the first pressure transmission sub-part 51 in the second direction Y is further less than the width D2 of respective one of the first-type binding terminals 31 in the second direction Y. In the second direction Y, an orthographic projection of the first pressure transmission sub-part 51 on the substrate layer 10 is in the range of an orthographic projection of the first-type binding terminal 31 on the substrate layer 10. Further, a central axis P1 of the first pressure transmission sub-part 51 in the first direction X coincides with the central axis of the first-type binding terminal 31 in the first direction X, so that the binding pressure applied to the first pressure transmission sub-part 51 can be applied to an intermediate region of the first-type binding terminal 31 through the substrate layer 10, thereby avoiding inclination of the side-pressure of the first-type binding terminal 31 due to uneven forces of the first-type binding terminal 31. It should be noted that, since the central axis P1 of the first pressure transmission sub-part 51 in the first direction X coincides with the central axis of the first-type binding terminal 31 in the first direction X, the central axis of the first-type binding terminal 31 in the first direction X is not shown in FIG. 5.

Referring to FIGS. 3 and 5, the first-type binding terminals 31 are disposed corresponding to the second-type binding terminals 32, and a vertical orthographic projection of each of the second-type binding terminal 32 in the first direction X overlaps the vertical orthographic projection of respective one of the first-type binding terminals 31 in the first direction X. Each of the second wirings 40 is further disposed corresponding to respective gap between the second-type binding terminals 32. Each of the pressure transmission parts 50 further includes a second pressure transmission sub-part 52 disposed corresponding to respective one of the second-type binding terminals 32. Alternatively, the second pressure transmission sub-part 52 is integrally formed with the first pressure transmission sub-part 51. That is, the first pressure transmission sub-part 51 is extended in the first direction X to form the second pressure transmission sub-part 52.

A third gap 321 is disposed between two adjacent ones of the second-type binding terminals 32, a width D1 of each of the second wirings 40 in the second direction Y is less than a distance L3 of the third gap 321, and an orthographic projection of each of the second wirings 40 on the substrate layer 10 is located within a range of an orthographic projection of the third gap 321 on the substrate layer 10. In other words, the orthographic projection of each of the second wirings 40 on the substrate layer 10 does not overlap the orthographic projection of respective one of the second-type binding terminals 32 on the substrate layer 10, so as to avoid generation of a coupling capacitance between the second wiring 40 and the second type binding terminal 32, so that the influence on the signal transmission of the second-type wiring 22 can be avoided.

Alternatively, the width D4 of each of the second-type binding terminals 32 in the second direction Y may be in the range from 125 microns to 225 microns, such as 125 microns, 135 microns, 150 microns, 175 microns, 190 microns, 210 microns, 225 microns, etc. The distance L3 of the third gap 321 may be in the range from 125 microns to 225 microns, such as 125 microns, 135 microns, 150 microns, 175 microns, 190 microns, 210 microns, 225 microns, etc. The width D4 of each of the second-type binding terminals 32 in the second direction Y may be equal to the distance L3 of the third gap 321. For example, both the width D2 and the distance L3 may be 175 microns. However, the present application is not limited thereto, and the width D4 of each of the second-type binding terminals 32 of the present application may be further greater than the distance L3 of the third gap 321.

A fourth gap 404 is disposed between two adjacent ones of the second wirings 40, which is in communication with the second gap 403. The second pressure transmission sub-part 52 is located in the fourth gap 404, and the width D5 of the second pressure transmission sub-part 52 in the second direction Y is less than a distance L4 of the fourth gap 404, so as to avoid short-circuiting of adjacent ones of the second wirings 40. Each of the second-type binding terminals 32 is disposed corresponding to the respective fourth gap 404, and the width D4 of the second-type binding terminal 32 in the second direction Y is less than the distance L4 of the respective fourth gap 404. An orthographic projection of each of the second-type binding terminals 32 on the substrate layer 10 is in the range of the orthographic projection of the fourth gap 404 on the substrate layer 10, so as to avoid overlapping of the second-type binding terminal 32 with the second wiring 40.

Alternatively, a width D5 of the second pressure transmission sub-part 52 in the second direction Y is further less than the width D4 of respective one of the second-type binding terminals 32 in the second direction Y. In the second direction Y, an orthographic projection of the second pressure transmission sub-part 52 on the substrate layer 10 is in the range of an orthographic projection of the second-type binding terminal 32 on the substrate layer 10. Further, a central axis P2 of the second pressure transmission sub-part 52 in the first direction X coincides with the central axis of the second-type binding terminal 32 in the first direction X, so that the binding pressure applied to the second pressure transmission sub-part 52 can be applied to an intermediate region of the second-type binding terminal 32 through the substrate layer 10, thereby avoiding inclination of the side-pressure of the second-type binding terminal 32 due to uneven forces of the second-type binding terminal 31. It should be noted that, since the central axis P2 of the second pressure transmission sub-part 52 in the first direction X coincides with the central axis of the second-type binding terminal 32 in the first direction X, the central axis of the second-type binding terminal 32 in the first direction X is not shown in FIG. 5.

How each of the second wirings 40 is electrically connected to respective one of the second-type binding terminals 32 and respective one of the second-type wirings 22 is then specifically described.

Referring to FIG. 5, one end of the second wiring 40 close to the first wiring 20 is electrically connected to the second-type wiring 22 through a first via 401, another end of the second wiring 40 away from the first wiring 20 is electrically connected to the second-type binding terminal 32 through a second via 402, and the second wiring 40 is electrically connected to one end of the second-type binding terminal 32 away from the first-type binding terminal 31.

Specifically, referring to FIG. 6, the substrate layer 10 includes the first via 401 penetrating the substrate layer 10, and the second wiring 40 may be electrically connected to the second wiring 40 by a metal connection part filled in the first via 401, and the metal connection part in the first via 401 may be formed simultaneously with the second wiring 40. The process of forming the first via 401 on the substrate layer 10 may use laser drilling or the like.

Referring to FIG. 7, the substrate layer 10 includes the second via 402 penetrating the substrate layer 10, the second wiring 40 may be electrically connected to the second-type binding terminal 32 by a metal connection part filled in the second via 402, and the metal connection part in the second via 402 may be formed simultaneously with the second wiring 40. The process of forming the second via 402 on the substrate layer 10 may use laser drilling or the like.

In the present embodiment, referring to FIG. 8, the pressure transmission part 50 is disposed corresponding to the first binding terminal 30. As such, when the flexible circuit board 100 is bound to the printed circuit board assembly 200, the pressure transmission part 50 can apply a positive pressure to the first binding terminal 30 through the substrate layer 10, so that there is inclination of a side pressure occurring in the first binding terminal 30 when the first binding terminal 30 of the flexible circuit board 100 is bound to the second binding terminal 201 of the printed circuit board assembly 200, thereby alleviating the technical problems that the inclination of the side pressure is generated when the conventional flexible circuit board and the printed circuit board assembly are bound.

Figure 9:
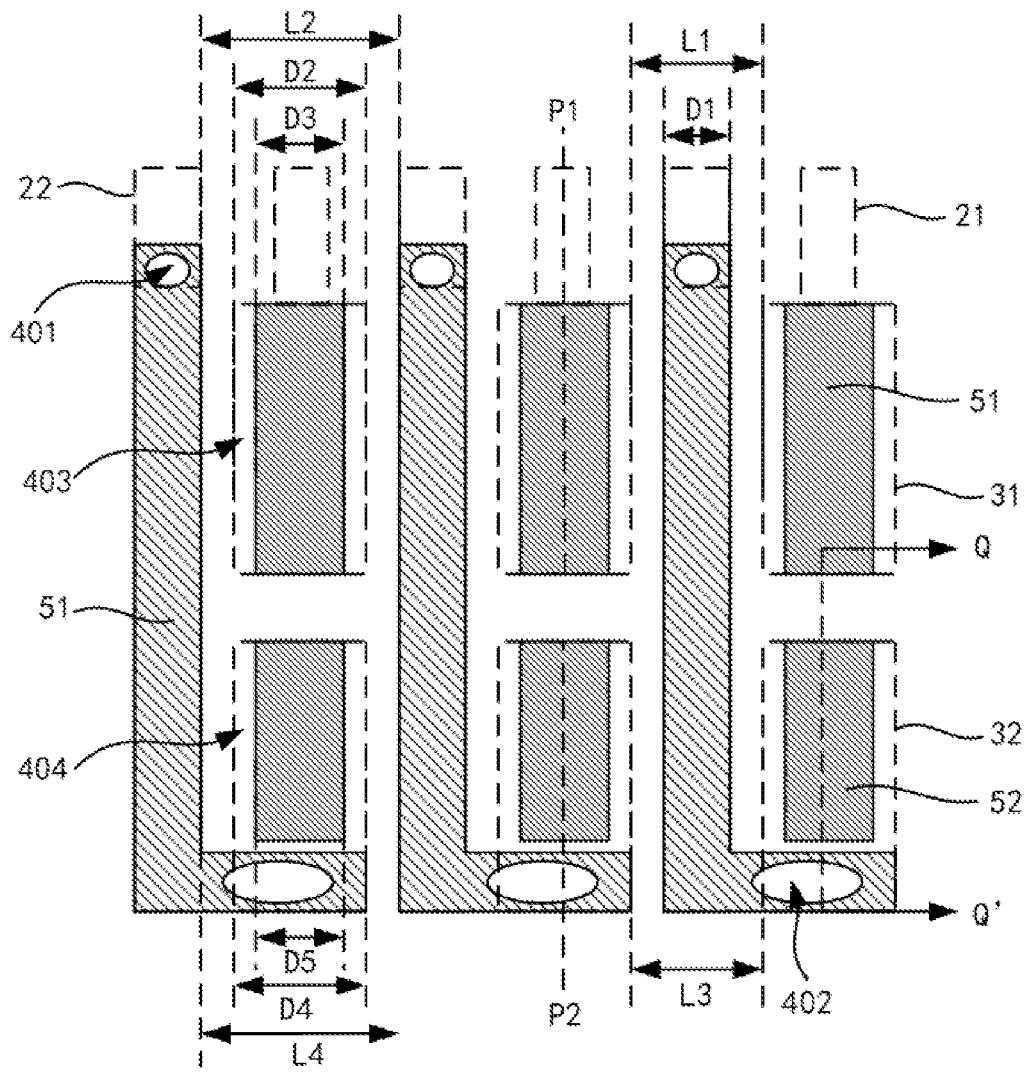
FIG. 9 is a top structural diagram of pressure transmission parts according to some embodiments of the present application.
Figure 10:
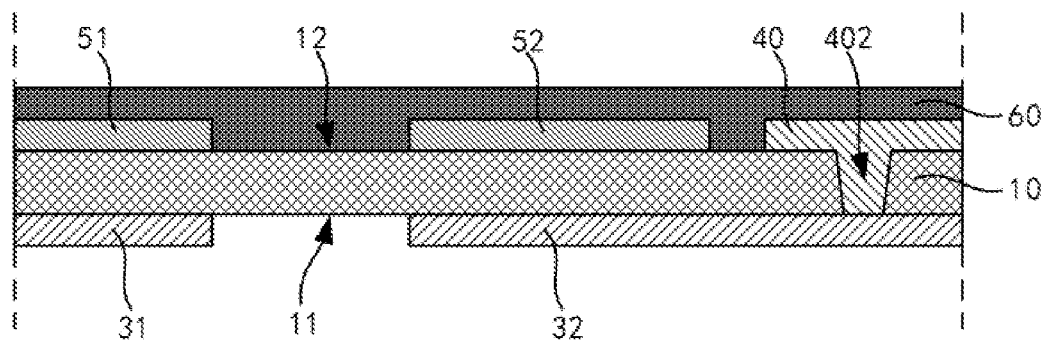
FIG. 10 is a schematic diagram of a cross-section structure along Q-Q' in FIG. 9.
Figure 11:
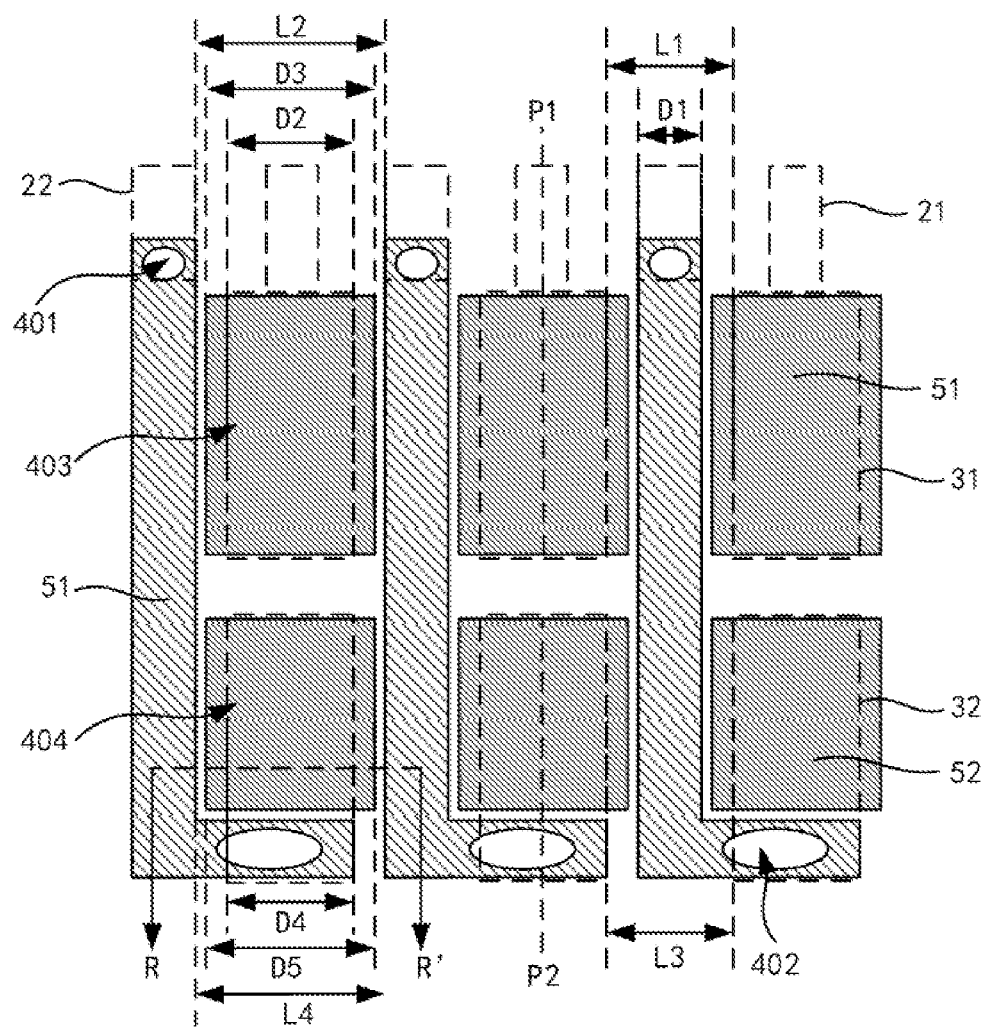
FIG. 11 is another top structural diagram of pressure transmission parts according to some embodiments of the present application.

In one embodiment, please refer to FIGS. 2-10, FIG. 9 is a top structural diagram of pressure transmission parts 50 according to some embodiments of the present application, and FIG. 10 is a schematic diagram of a cross-section structure along Q-Q' in FIG. 9. In contrast to the above-described embodiments, the first pressure transmission sub-part 51 and the second pressure transmission sub-part 52 are disposed separately, the first pressure transmission sub-part 51 is disposed corresponding to the second pressure transmission sub-part 52, and a gap disposed between the first pressure transmission sub-part 51 and the second pressure transmission sub-part 52.

Specifically, referring to FIG. 9, the first pressure transmission sub-part 51 is disposed corresponding to the first-type binding terminal 31, a central axis P1 of the first pressure transmission sub-part 51 in the first direction X coincides with a central axis of respective one of the first-type binding terminals 31 in the first direction X, and the width D3 of the first pressure transmission sub-part 51 in the second direction Y is less than the width D2 of the first-type binding terminal 31 in the second direction Y. In other embodiments, the width D3 of the first pressure transmission sub-part 51 in the second direction Y can be further less than the width D2 of respective one of the first-type binding terminals 31 in the second direction Y, so as to better improve inclination of the side pressure occurring in the first-type binding terminal 31.

The central axis P1 of the first pressure transmission sub-part 51 in the second direction Y coincides with the central axis of the first-type binding terminal 31 in the second direction Y, and one end of the first pressure transmission sub-part 51 in the first direction X is flush with one end of the first-type binding terminal 31 in the first direction X. In other words, the orthographic projection of the first pressure transmission sub-part 51 on the substrate layer 10 coincides with the orthographic projection of the first-type binding terminal 31 on the substrate layer 10.

The second pressure transmission sub-part 52 is disposed corresponding to the second-type binding terminal 32, the central axis P2 of the second pressure transmission sub-part 52 in the first direction X coincides with the central axis P2 of the second-type binding terminal 32 in the first direction X, and the central axis P2 of the second pressure transmission sub-part 52 in the first direction X coincides with the central axis P1 of the first pressure transmission sub-part 51 in the first direction X. The width D5 of the second pressure transmission sub-part 52 in the second direction Y is less than the width D4 of the second-type binding terminal 32 in the second direction Y. In other embodiments, the width D5 of the second pressure transmission sub-part 52 in the second direction Y may be further equal to the width D4 of the second-type binding terminal 32 in the second direction Y to better improve inclination of the side pressure occurring in the second-type binding terminal 32.

Referring to FIG. 10, a gap is disposed between the second pressure transmission sub-part 52 and the first pressure transmission sub-part 51, and another gap is further disposed between the second pressure transmission sub-part 52 and a portion of the second wiring 40 electrically connected to the second-type binding terminal 32, so as to avoid short-circuiting of the second pressure transmission sub-part 52 and the second wiring 40. As such, one end of the second pressure transmission sub-part 52 in the first direction X is flush with one end of the second-type binding terminal 32 in the first direction X, and a certain gap is maintained between another end of the second pressure transmission sub-part 52 in the first direction X and the second wiring 40. Other illustration refers to the above-mentioned embodiments, which is repeatedly described herein.

Figure 12:
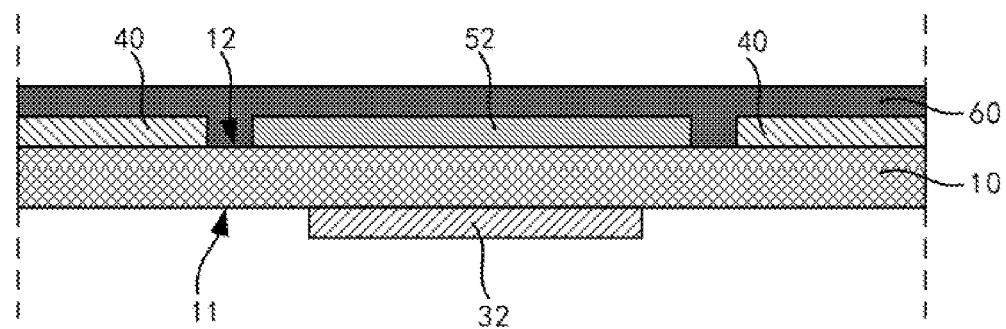
FIG. 12 is a schematic diagram of a cross-section structure along R-R' in FIG. 10.

In one embodiment, please refer to FIGS. 2-12, FIG. 11 is another top structural diagram of pressure transmission parts 50 according to some embodiments of the present application, and FIG. 12 is a schematic diagram of a cross-section structure along R-R' in FIG. 10. In contrast to the above embodiments, referring to FIG. 11, the width D3 of the first pressure transmission sub-part 51 in the second direction Y is greater than the width D2 of the first-type binding terminal 31 in the second direction Y, and the width D5 of the second pressure transmission sub-part 52 in the second direction Y is greater than the width D4 of the second-type binding terminal 32 in the second direction Y. Taking the second pressure transmission sub-part 52 as an example, referring to FIG. 12, the width D5 of the second pressure transmission sub-part 52 is greater than the width D4 of the second-type binding terminal 32, and the orthographic projection of the second pressure transmission sub-part 52 on the substrate layer 10 covers the orthographic projection of the second-type binding terminal 32 on the substrate layer 10. Other illustration refers to the above-mentioned embodiments, which is repeatedly described herein.

Figure 13:
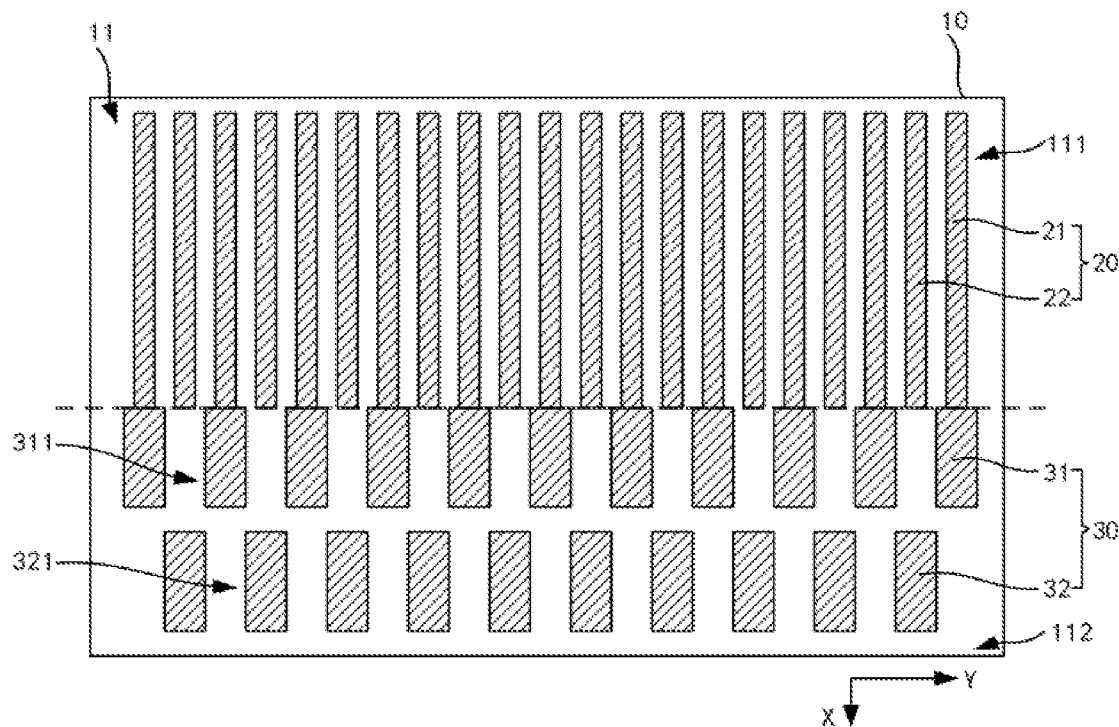
FIG. 13 is a schematic diagram of arrangement of first-type binding terminals and second-type binding terminals according to some embodiments of the present application.
Figure 14:
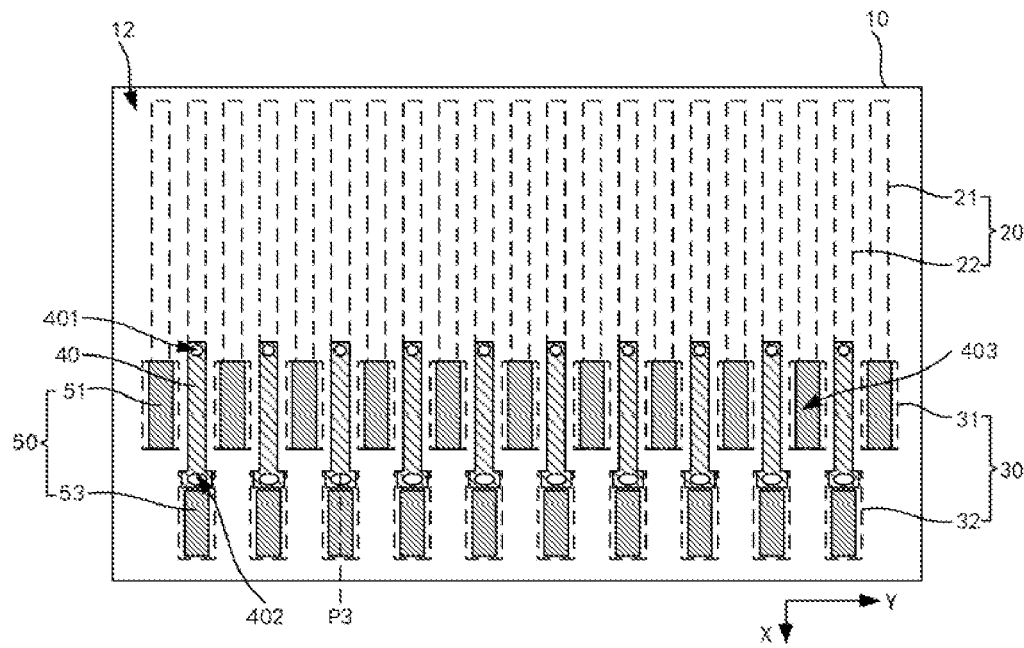
FIG. 14 is a schematic diagram of connection of second-type binding terminals of FIG. 13 to second wirings.

In one embodiment, referring to FIGS. 2 to 14, FIG. 13 is a schematic diagram of arrangement of first-type binding terminals 31 and second-type binding terminals 32 according to some embodiments of the present application, and FIG. 14 is a schematic diagram of connection of second-type binding terminals 32 of FIG. 13 to second wirings 40. In contrast to the above embodiments, referring to FIG. 13, the first-type binding terminals 31 and the second-type binding terminals 32 are interleaved, that is, each of the first-type binding terminals 31 is disposed corresponding to a gap between two adjacent ones of the second-type binding terminals 32, and each of the second-type binding terminals 32 is disposed corresponding to another gap between two adjacent ones of the first-type binding terminals 31.

Referring to FIG. 14, the second wiring 40 is electrically connected to one end of the second-type binding terminal 32 close to the first-type binding terminal 31. Each of the pressure transmission parts 50 further includes a third pressure transmission sub-part 53 disposed corresponding to respective one of the second-type binding terminals 32. A central axis P3 of the third pressure transmission sub-part 53 in the first direction X coincides with a central axis of the second-type binding terminal 32 in the first direction X. Other illustration refers to the above-mentioned embodiments, which is repeatedly described herein.

Figure 15:
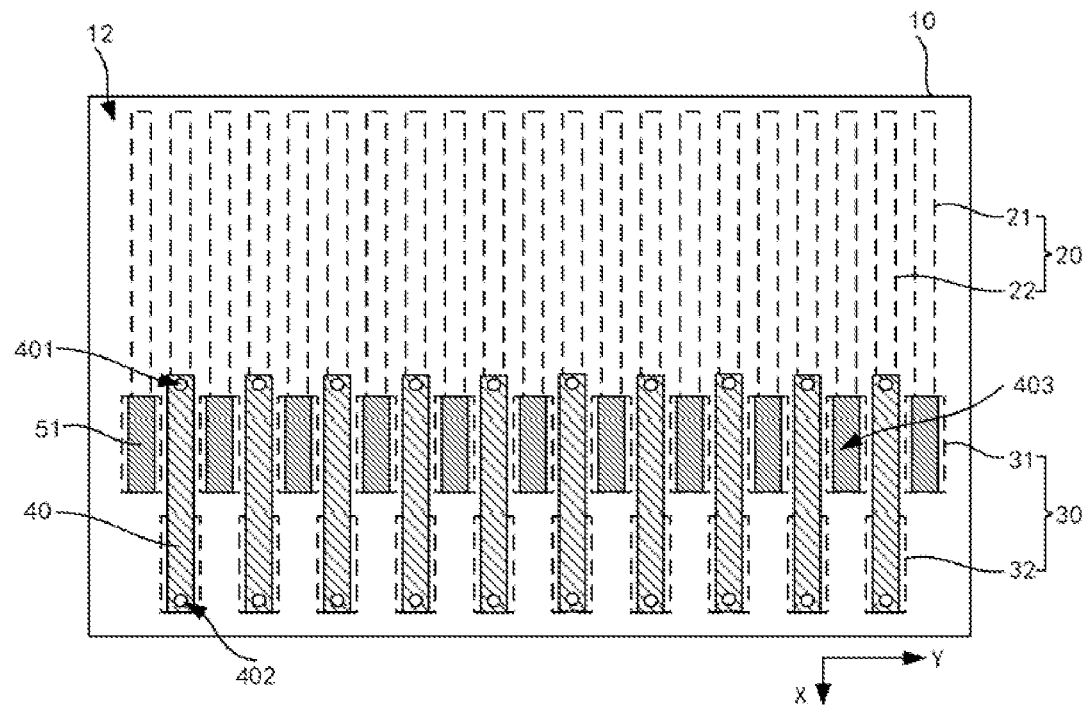
FIG. 15 is another schematic diagram of connection of second-type binding terminals to second wirings according to some embodiments of the present application.

In one embodiment, please refer to FIGS. 2 to 15, FIG. 15 is another schematic diagram of connection of second-type binding terminals 32 to second wirings 40 according to some embodiments of the present application. In contrast to the above-described embodiments, referring to FIG. 15, the second wiring 40 is electrically connected to one end of the second-type binding terminal 32 away from the first-type binding terminal 31, and a central axis of the second wiring 40 in the first direction X coincides with a central axis of the second-type binding terminal 32 in the first direction X, so that the third pressure transmission sub-section 53 does not need to be additionally disposed. Other illustration refers to the above-mentioned embodiments, which is repeatedly described herein.

Figure 16:
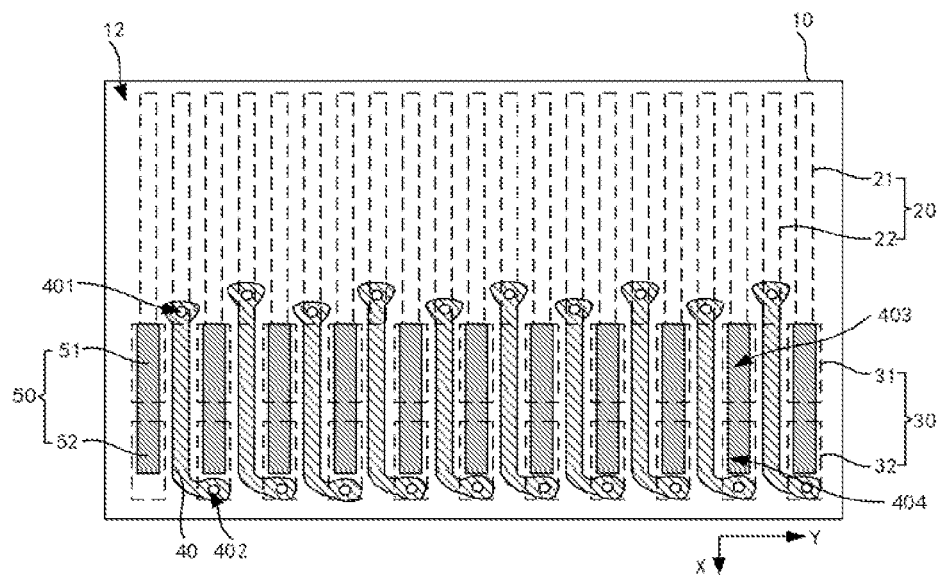
FIG. 16 is yet another schematic diagram of connection of second-type binding terminals to second wirings according to some embodiments of the present application.

In one embodiment, please refer to FIGS. 2 to 16, FIG. 16 is yet another schematic diagram of connection of second-type binding terminals 32 to second wirings 40 according to some embodiments of the present application. In contrast to the above embodiments, referring to FIG. 16, connection points between each of the second wirings 40 and respective one of the second-type wirings 22 are interleaved with each other, that is, connection points between either one of two adjacent ones of the second wirings 40 and the respective one of the second-type traces 22 do not coincide with each other in the second direction Y. In other words, the connection points between either one of the two adjacent second wirings 40 and the respective second-type trace 22 have different heights in the first direction X. As such, by interleaving the connection points between each of the second wirings 40 and respective one of the second-type wirings 22, a contact area of electrical connection between the second wiring 40 and the second-type wiring 22 can be increased, thereby improving the stability of the electrical connection between the second wiring 40 and the second-type wiring 22. A position in which the connection point between the second wiring 40 and the second-type wiring 22 is located is a position where the first via 401 is located.

Further, one portion of the second wiring 40 connected to the second-type wiring 22 and another portion of the second wiring 40 connected to the second-type binding terminal 32 are both block-shaped, where the block-shaped surface shape may be elliptical, circular, or the like, and the maximum size of the block-shaped connection part is greater than the width of the second wiring 40, so as to further improve the stability of the connection of the second wiring 40 to the second-type wiring 22/the second-type binding terminal 32. The maximum size of the block-shaped connection part depends on the block-shaped surface shape. For example, when the block-shaped surface shape is an ellipse, the maximum size of the block-shaped connection part is the length of the long axis of the ellipse. In addition, a corner where the second wiring 40 is electrically connected to the second-type binding terminal 32 is a rounded corner to reduce a bending stress of the second wiring 40. Other illustration refers to the above-mentioned embodiments, which is repeatedly described herein.

Figure 17:
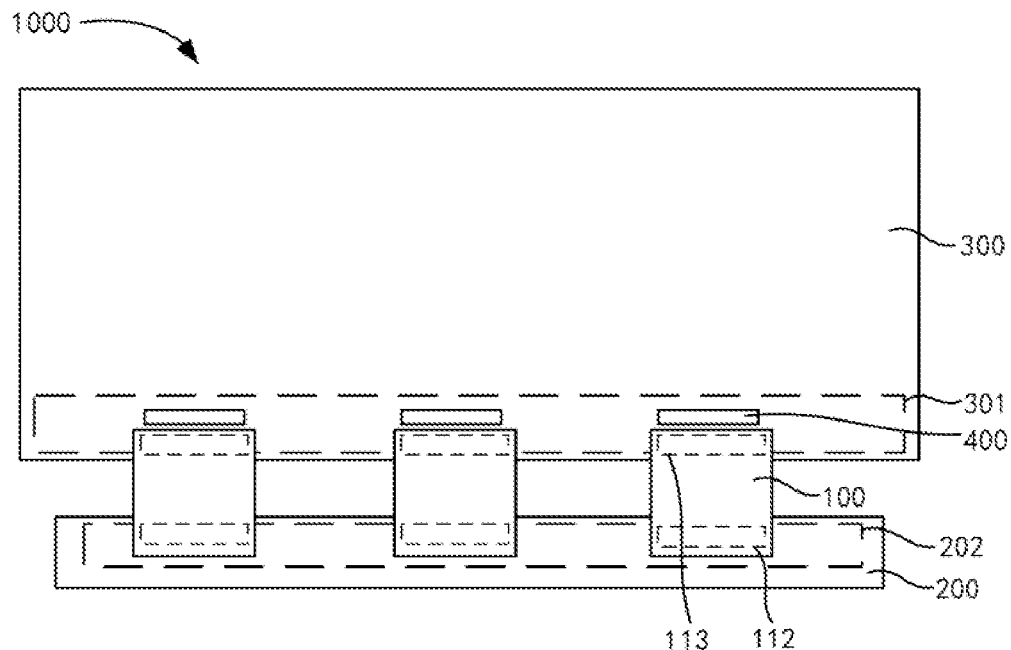
FIG. 17 is a top structural diagram of a display module according to some embodiments of the present application.
Figure 18:
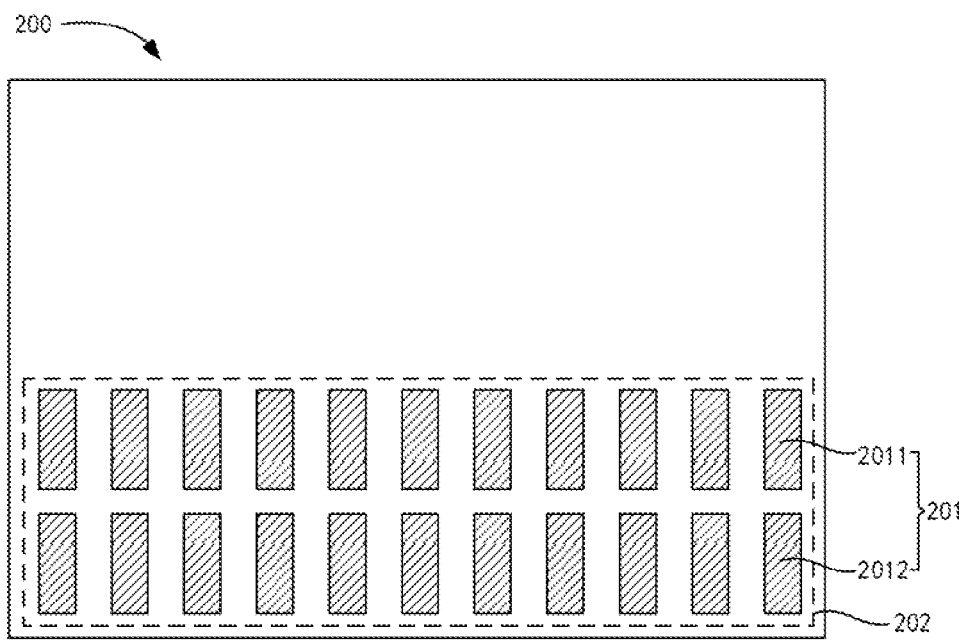
FIG. 18 is a schematic diagram of arrangement of second binding terminals of a printed circuit board assembly of FIG. 17.

In one embodiment, the present application further provides a display module. Please refer to FIGS. 2-18, FIG. 17 is a top structural diagram of a display module according to some embodiments of the present application, and FIG. 18 is a schematic diagram of arrangement of second binding terminals of a printed circuit board assembly of FIG. 17. Referring to FIG. 17, the display module 1000 includes a display panel 300, a printed circuit board assembly 200, and a flexible circuit board 100 electrically connected between the display panel 300 and the printed circuit board assembly 200, where the flexible circuit board 100 includes the flexible circuit board 100 described in one of the foregoing embodiments. The printed circuit board assembly 200 includes a second binding region 202 opposite to the first binding region 112 of the flexible circuit board 100. The printed circuit board assembly 200 is provided with a plurality of second binding terminals 201 in the second binding region 202. Each of the second binding terminals 201 is bound to respective one of the first binding terminals 30 of the flexible circuit board 100.

Specifically, with reference to FIGS. 3 and 18, the second binding terminals 201 include third-type binding terminals 2011 and fourth-type binding terminals 2012 electrically isolated from each other, each of the third-type binding terminals 2011 is bound to respective one of the first-type binding terminals 31 of the flexible circuit board 100, and each of the fourth-type binding terminals 2012 is bound to respective one of the second-type binding terminals 32 of the flexible circuit board 100.

In addition, referring to FIG. 8, an orthographic projection of each of the first binding terminals 30 on the printed circuit board assembly 200 is located within a range of an orthographic projection of respective one of the second binding terminals 201 on the printed circuit board assembly 200, so as to ensure that the first binding terminal 30 can have a sufficient effective contact area with the second binding terminal 201. Further, an orthographic projection of a portion of the pressure transmission part 50 corresponding to the first binding terminal 30 on the substrate layer 10 is located within a range of an orthographic projection of the first binding terminal 30 on the substrate layer 10. As such, an orthographic projection of a portion of the pressure transmission part 50 corresponding to the first binding terminal 30 on the printed circuit board assembly 200 is located within a range of an orthographic projection of the second binding terminal 201 on the printed circuit board assembly 200.

Alternatively, the central axis of each of the first binding terminals 30 coincides with the central axis of the respective one of the second binding terminals 201 while the central axis of each of the first binding terminals 30 coincides with the central axis of the respective one of the pressure transmission parts 50, so that the binding pressure applied to the pressure transmission part 50 can be applied to the intermediate region of the respective first binding terminal 30 through the substrate layer 10, and the binding pressure applied to the intermediate region of the respective first binding terminal 30 can be transmitted to the intermediate region of the respective one of the second binding terminals 201, so as to enable the first-type binding terminal 31 to be effectively bound to the second binding terminal 201. As such, problems of inclination of the side pressure of the first-type binding terminal 31 relative to the second binding terminal 201 and thus abnormal bonding impedance of the binding region and abnormal reliability test can be further avoided.

Still referring to FIG. 17, the flexible circuit board 100 further includes a third binding region 113 opposite to the first binding region 112, where the third binding region 113 is correspondingly bound to the fourth binding region 301 of the display panel 300, that is, each of the third binding terminals of the third binding region 113 of the flexible circuit board 100 is bound to respective one of the fourth binding terminals of the fourth binding region 301 of the display panel 300. The fourth binding region 301 of the display panel 300 is further bound with an integrated circuit (IC) 400, where the flexible circuit board 100 transmits a signal of the printed circuit board 200 to the integrated circuit 400. The display panel 300 includes an organic light emitting diode display panel, a liquid crystal display panel, and the like.

Based on the same inventive concept, yet another embodiment of the present application further provides an electronic device, including the display module 1000 of any one of the foregoing embodiments. The electronic device includes an electronic display device such as a notebook computer, a tablet computer, and a television.

It can be known according to the above embodiments that, in the flexible circuit board, the display module, and the electronic device provided in the present application, the flexible circuit board includes a substrate layer, both a plurality of first wirings and a plurality of first binding terminals disposed on a first surface of the substrate layer, and both a plurality of second wirings and a plurality of pressure transmission parts disposed on a second surface of the substrate layer, where the first surface includes a wiring region and a first binding region located on one side of the wiring region, the plurality of first wirings are located in the wiring region, the plurality of first wirings are extended in a first direction and spaced apart in a second direction, the plurality of first wirings include first-type wirings and second-type wirings electrically isolated from each other, the plurality of first binding terminals are extended in the first direction and spaced apart in the second direction, the plurality of first binding terminals include first-type binding terminals and second-type binding terminals electrically isolated from each other, the second-type binding terminals are located on one side of the first-type binding terminals away from the first wirings, each of the first-type binding terminals is electrically connected to at least one of the first-type wirings, and each of the second-type binding terminals is electrically connected to at least one of the second-type wirings, the plurality of second wirings are disposed corresponding to gaps among the first-type binding terminals, each of the second wirings is electrically connected between the second-type wirings and the second-type binding terminals, and each of the pressure transmission parts includes at least a portion corresponding to at least a portion of the first binding terminals to enable the pressure transmission part to transmit pressure to the first binding terminals through the substrate layer. As such, when the flexible circuit board is bound to the printed circuit board assembly, each of the pressure transmission parts can apply a positive pressure to the binding terminal through the substrate layer, thereby avoiding inclination of a side pressure occurring in the binding terminal is avoided and solving the technical problems that the inclination of the side pressure is generated when the flexible circuit board and the printed circuit board assembly are bound.

In the foregoing embodiments, descriptions of the embodiments are emphasized. A portion that is not described in detail in an embodiment may refer to related descriptions in another embodiment.

The embodiments of the present application are described in detail above. In this specification, principles and implementations of the present application are illustrated by applying specific examples herein. The description of the above embodiments is only used to help understand the technical solutions and core ideas of the present application; those of ordinary skill in the art should understand that it is still possible to modify the technical solutions recorded in the foregoing embodiments, and these modifications or replacements do not cause the essence of the corresponding technical solutions to deviate from the scope of the technical solutions of the embodiments of the present application.

What is claimed is:

1. A flexible pixel circuit, comprising: a substrate layer including a first surface and an opposite second surface, wherein the first surface includes a wiring region and a first binding region disposed on one side of the wiring region; a plurality of first wirings disposed on the first surface and located in the wiring region, wherein the plurality of first wirings are extended in a first direction and spaced apart in a second direction, and the plurality of first wirings include first-type wirings and second-type wirings electrically isolated from each other; a plurality of first binding terminals disposed on the first surface and located in the first binding region, wherein the plurality of first binding terminals are extended in the first direction and spaced apart in the second direction, the plurality of first binding terminals include first-type binding terminals and second-type binding terminals electrically isolated from each other, the second-type binding terminals are located on one side of the first-type binding terminals away from the first wirings, each of the first-type binding terminals is electrically connected to at least one of the first-type wirings, and each of the second-type binding terminals is electrically connected to at least one of the second-type wirings; a plurality of second wirings disposed on the second surface and corresponding to gaps among the first-type binding terminals, wherein each of the second wirings is electrically connected between respective one the second-type wirings and respective one of the second-type binding terminals; and a plurality of pressure transmission parts disposed on the second surface, wherein each of the pressure transmission parts includes at least a portion corresponding to at least a portion of respective one of the first binding terminals to enable the pressure transmission part to transmit a pressure to the first binding terminal through the substrate layer, wherein a first gap is disposed between two adjacent ones of the first-type binding terminals, a width of each of the second wirings in the second direction is less than a distance of the first gap, and an orthographic projection of each of the second wirings on the substrate layer is located within a range of an orthographic projection of the first gap on the substrate layer.

2. The flexible circuit board of claim 1, wherein an elastic modulus of each of the pressure transmission parts is greater than or equal to an elastic modulus of respective one of the second wirings.

3. The flexible circuit board of claim 2, wherein a material of each of the pressure transmission parts is the same as a material of respective one of the second wirings.

4. The flexible circuit board of claim 2, wherein a thickness of each of the pressure transmission parts is greater than or equal to a thickness of respective one of the second wirings in a direction perpendicular to the substrate layer.

5. The flexible circuit board of claim 1, further comprising a cover layer that covers the second wirings, the pressure transmission parts, and the substrate layer, wherein a thickness of the cover layer covering the second wirings is less than a thickness of the cover layer covering the substrate layer.

6. The flexible circuit board of claim 1, wherein each of the pressure transmission parts includes a first pressure transmission sub-part located between two adjacent ones of the second wirings and disposed corresponding to respective one of the first-type binding terminals.

7. The flexible circuit board of claim 6, wherein a second gap is disposed between the two adjacent ones of the second wirings, the first pressure transmission sub-part is located within the second gap, and a width of the first pressure transmission sub-part in the second direction is less than a distance of the second gap.

8. The flexible circuit board of claim 7, wherein a central axis of the first pressure transmission sub-part in the first direction coincides with a central axis of respective one of the first-type binding terminals in the first direction.

9. The flexible circuit board of claim 6, wherein the first-type binding terminals are disposed opposite to the second-type binding terminals, the second wirings are further disposed corresponding to gaps among the second-type binding terminals, and each of the pressure transmission parts further includes a second pressure transmission sub-part disposed corresponding to respective one of the second-type binding terminals, and each of the second wirings is electrically connected to one end of the respective one of the second-type binding terminals away from the first-type binding terminals.

10. The flexible circuit board of claim 9, wherein a third gap is disposed between two adjacent ones of the second-type binding terminals, a width of each of the second wirings in the second direction is less than a distance of the third gap, and an orthographic projection of each of the second wirings on the substrate layer is located within a range of an orthographic projection of the third gap on the substrate layer.

11. The flexible circuit board of claim 10, wherein a fourth gap is further disposed between the two adjacent ones of the second wirings, the second pressure transmission sub-part is located within the fourth gap, and a width of the second pressure transmission sub-part in the second direction is less than a distance of the fourth gap.

12. The flexible circuit board of claim 11, wherein a central axis of the second pressure transmission sub-part in the first direction coincides with a central axis of respective one of the second-type binding terminals in the first direction.

13. The flexible circuit board of claim 6, wherein the first-type binding terminals are interleaved with the second-type binding terminals, and each of the second wirings is electrically connected to one end of respective one of the second-type binding terminals close to the first-type binding terminals; each of the pressure transmission parts further includes a third pressure transmission sub-part disposed corresponding to respective one of the second-type binding terminals; and a central axis of the third pressure transmission sub-part in the first direction coincides with a central axis of respective one of the second-type binding terminals in the first direction.

14. The flexible circuit board of claim 6, wherein the first-type binding terminals are interleaved with the second-type binding terminals, each of the second wirings is electrically connected to one end of respective one of the second-type binding terminals away from the first-type binding terminals, and a central axis of each of the second wirings in the first direction coincides with a central axis of respective one of the second-type binding terminals in the first direction.

15. A display module, comprising a display panel, a printed circuit board assembly, and a flexible circuit board electrically connected between the display panel and the printed circuit board assembly and including the flexible circuit board of claim 1; wherein the printed circuit board assembly includes a second binding region opposite to the first binding 26 region of the flexible circuit board and is provided with a plurality of second binding terminals in the second binding region, and each of the second binding terminals is bound to respective one of the first binding terminals of the flexible circuit board, wherein an orthographic projection of each of the first binding terminals on the printed circuit board assembly is located within a range of an orthographic projection of respective one of the second binding terminals on the printed circuit board assembly.

16. The display module of claim 15, wherein an orthographic projection of a portion of the pressure transmission part corresponding to the first binding terminal on the printed circuit board assembly is located within a range of an orthographic projection of the second binding terminal on the printed circuit board assembly.

17. The display module of claim 15, wherein the second binding terminals include third-type binding terminals and fourth-type binding terminals electrically isolated from each other, each of the third-type binding terminals is bound to respective one of the first-type binding terminals on the flexible circuit board, and each of the fourth-type binding terminals is bound to respective one of the second-type binding terminals of the flexible circuit board.

18. An electronic device, comprising the display module of claim 15.

\* \* \* \* \*